US012568862B2

(12) United States Patent
Konishi

(10) Patent No.: US 12,568,862 B2
(45) Date of Patent: Mar. 3, 2026

(54) STACKED SEMICONDUCTOR DEVICE AND METHOD OF FABRICATING THE SAME

(71) Applicant: Powerchip Semiconductor Manufacturing Corporation, Hsinchu (TW)

(72) Inventor: Yasuhiro Konishi, Osaka (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 678 days.

(21) Appl. No.: 18/078,096

(22) Filed: Dec. 9, 2022

(65) Prior Publication Data

US 2024/0194638 A1     Jun. 13, 2024

(51) Int. Cl.
H01L 25/065 (2023.01)
H01L 23/00 (2006.01)
(Continued)

(52) U.S. Cl.
CPC ........ H01L 25/0652 (2013.01); H01L 23/481 (2013.01); H01L 24/02 (2013.01); H01L 24/05 (2013.01); H01L 24/06 (2013.01); H01L 24/08 (2013.01); H01L 24/95 (2013.01); H01L 25/18 (2013.01); H01L 25/50 (2013.01); *H01L 2224/02373* (2013.01); *H01L 2224/02375* (2013.01); *H01L 2224/0557* (2013.01); *H01L 2224/05624* (2013.01); *H01L 2224/05647* (2013.01); *H01L 2224/05655* (2013.01);
(Continued)

(58) Field of Classification Search
CPC .................................................. H01L 25/0652
See application file for complete search history.

(56) References Cited

U.S. PATENT DOCUMENTS 9,111,941 B2 * 8/2015 Gong ................ H01L 23/49827
11,616,003 B2 * 3/2023 Olson ................... H01L 23/481
257/774
(Continued)

FOREIGN PATENT DOCUMENTS

TW          202240817          10/2022
TW          202245079          11/2022

OTHER PUBLICATIONS

"Office Action of Taiwan Counterpart Application", issued on Aug. 24, 2023, pp. 1-4.

*Primary Examiner* — William A Harriston
(74) *Attorney, Agent, or Firm* — JCIPRNET

(57)     ABSTRACT

A stacked semiconductor device includes first chips and a second chip. The first chips are arranged in an array, and includes first and second type through vias, an internal wire layer, a redistribution line and conductive pins. The internal wire layer is disposed on and electrically connected to the first and second type through vias. The redistribution line is disposed on and electrically connected to the second type through vias and the internal wire layer, wherein the redistribution line extends from a top surface of the second type through vias to a position non-overlapped with the second type through vias. The conductive pins are disposed on and electrically connected to the redistribution line. The second chip is stacked on the first chips, wherein the second chip includes connection pins, and the second chip is connected to the first chips by bonding the connection pins to the conductive pins.

15 Claims, 7 Drawing Sheets

(51) Int. Cl.
    *H01L 23/48*        (2006.01)
    *H01L 25/00*        (2006.01)
    *H01L 25/18*        (2023.01)

(52) U.S. Cl.
    CPC ............... *H01L 2224/05666* (2013.01); *H01L 2224/05684* (2013.01); *H01L 2224/0616* (2013.01); *H01L 2224/06182* (2013.01); *H01L 2224/08145* (2013.01); *H01L 2224/95* (2013.01)

(56) References Cited

U.S. PATENT DOCUMENTS

| | | | |
|---|---|---|---|
| 2011/0068433 A1* | 3/2011 | Kim ...................... H01L 23/552 | |
| | | | 257/659 |
| 2012/0018885 A1* | 1/2012 | Lee ..................... H01L 25/0657 | |
| | | | 257/738 |
| 2012/0091580 A1* | 4/2012 | Jeong ................. H01L 25/0657 | |
| | | | 257/737 |
| 2012/0106117 A1* | 5/2012 | Sundaram ......... H01L 23/49827 | |
| | | | 257/772 |
| 2014/0051189 A1* | 2/2014 | Kai-Jun .................. H01L 22/14 | |
| | | | 257/E21.531 |
| 2014/0264769 A1* | 9/2014 | Chen ...................... H01L 22/14 | |
| | | | 438/15 |
| 2015/0091179 A1* | 4/2015 | Shenoy ............... H01L 25/0657 | |
| | | | 438/109 |
| 2015/0235949 A1* | 8/2015 | Yu ........................... H01L 24/81 | |
| | | | 257/774 |
| 2016/0111386 A1* | 4/2016 | England ................. H01L 24/06 | |
| | | | 438/107 |
| 2016/0307862 A1* | 10/2016 | Lin ...................... H01L 25/0657 | |
| 2019/0311973 A1* | 10/2019 | Ingerly .................. H01L 24/05 | |
| 2020/0013754 A1* | 1/2020 | Gao .................... H01L 23/5384 | |
| 2020/0168527 A1 | 5/2020 | Chang et al. | |
| 2021/0125967 A1 | 4/2021 | Zhai | |
| 2021/0193640 A1* | 6/2021 | Song ..................... H01L 23/481 | |
| 2021/0233901 A1* | 7/2021 | Or-Bach ................. H01L 22/12 | |
| 2021/0375829 A1* | 12/2021 | Or-Bach ................. H01L 24/08 | |
| 2022/0013485 A1* | 1/2022 | Or-Bach ................. H01L 23/544 | |
| 2022/0157782 A1* | 5/2022 | Zhai ........................ H01L 24/97 | |
| 2022/0199517 A1* | 6/2022 | Dabral .................... H01L 24/80 | |
| 2022/0359436 A1* | 11/2022 | Cheng ................... H01L 25/105 | |
| 2022/0384356 A1* | 12/2022 | Pu ........................... H01L 24/20 | |
| 2023/0051863 A1* | 2/2023 | Hush ................... G06F 13/1673 | |
| 2024/0006374 A1* | 1/2024 | Chang ..................... H01L 24/08 | |
| 2024/0021534 A1* | 1/2024 | Liff ......................... H01L 24/19 | |
| 2024/0153911 A1* | 5/2024 | Zhou ...................... H01L 25/50 | |
| 2024/0321833 A1* | 9/2024 | Zhai ........................ H01L 24/96 | |

\* cited by examiner

STACKED SEMICONDUCTOR DEVICE AND METHOD OF FABRICATING THE SAME

BACKGROUND

Technical Field

The present disclosure relates to a stacked semiconductor device. In particular, the disclosure relates to a stacked semiconductor device and a method of fabricating the same.

Description of Related Art

Stacked semiconductor device composed of heterogeneous chips, such as logic chips and memory chips are formed by wafer-on-wafer technology. Typically, there is a difference between the logic chip size and the memory chip size, whereby the stacked device may be composed of a single logic chip stacked on multiple memory chips. The memory chips on a wafer are fabricated uniformly with a set of photomasks. In general, the memory chips may be coupled to various logic chips, and the quantity of memory chips used in a stacked device is variable according to the logic chip size to be coupled with.

As means for providing interconnection between the signals of logic and memory chips, face to face bonding can be utilized in which metal terminals (conductive pins/connection pins) provided on the surfaces of both chips are directly bonded together. On the other hand, bonding pads which are used to connect signals or power supply of the chips to pins of a device package are provided on the backside of the memory chips. In this case, those signals are routed from the frontside to the backside of the memory chips by through substrate vias (TSVs).

The TSVs in a single memory chip are provided at certain positions for connecting signals of the memory chip to bonding pads on the backside of the chip. However, as the positions of the metal terminals (conductive pins/connection pins) on the logic chip are unique to each logic chip design, the TSVs used for connecting the signals of the logic chip to the bonding pads are not fixed. Usually, semiconductor memories are fabricated with "photomask sets". Thus, if the positions of the TSVs are changed according to a partner logic chip, the "photomask sets" must also be redesigned.

SUMMARY

In accordance with some embodiments of the present disclosure, a stacked semiconductor device is fabricated by bonding memory chips with logic chip without utilizing extra photomask sets.

In one embodiment of the present disclosure, a stacked semiconductor device includes a plurality of first chips and a second chip. The plurality of first chips is arranged in an array, and includes first type through vias, second type through vias, an internal wire layer, a redistribution line and a plurality of conductive pins. The internal wire layer is disposed on and electrically connected to the first type through vias and the second type through vias. The redistribution line is disposed on and electrically connected to the second type through vias and the internal wire layer, wherein the redistribution line extends from a top surface of the second type through vias to a position non-overlapped with the second type through vias. The conductive pins are disposed on and electrically connected to the redistribution line. The second chip is stacked on the first chips, wherein the second chip includes a plurality of connection pins, and the second chip is connected to the first chips by bonding the connection pins to the conductive pins.

In some embodiments, the first chips are arranged in an array of N rows and M columns, and N and M are an integer, and wherein an outline of the second chip corresponds to an outline of the first chips arranged in the array.

In some embodiments, a single second chip is bonded to the first chips arranged in an array of 2 rows and 4 columns.

In some embodiments, a single second chip is bonded to the first chips arranged in an array of 2 rows and 2 columns.

In some embodiments, each of the first chips arranged in the array are separated by dicing lines, and wherein the first chips further include an extended redistribution line disposed on and electrically connected to the second type through vias and the internal wire layer, wherein the extended redistribution line extends from the top surface of the second type through vias of one of the first chips across the dicing lines towards the conductive pins of another one of the first chips.

In some embodiments, the extended redistribution line extends across two adjacent first chips.

In some embodiments, the extended redistribution line extends across four adjacent first chips.

In some embodiments, the stacked semiconductor device further includes conductive terminals disposed on and electrically connected to the first type through vias and the second type through vias.

In some embodiments, the first type through vias electrically connects the signals or power supply lines of the first chips to the conductive terminals, and the second type through vias electrically connects the signals or power supply lines of the second chip to the conductive terminals.

In some embodiments, the first type through vias are arranged in a first column in each of the first chips, and the second type through vias are arranged in a second column in each of the first chips.

In some embodiments, each of the first chips further includes a transistor structure and another redistribution line. The redistribution line is disposed on and electrically connected to the transistor structure through the internal wire layer, and extends from an internal wire of the internal wire layer located on top of the transistor structure to a position away from the internal wire. The conductive pins are disposed on and electrically connected to the redistribution line.

In some embodiments, the first chips include memory chips and the second chip includes a logic chip.

In another embodiment of the present disclosure, a method of fabricating a stacked semiconductor device is described. The method includes the following steps. First chips are formed on a semiconductor wafer by forming first type through vias and second type through vias, forming an internal wire layer, forming a redistribution line, and forming conductive pins. The first type through vias and second type through vias are formed over a first wafer substrate. The internal wire layer is formed on and electrically connected to the first type through vias and the second type through vias, wherein the first type through vias, the second type through vias and the internal wire layer are formed through a first group of photomasks. The redistribution line is formed on and electrically connected to the second type through via and the internal wire layer, wherein the redistribution line extends from a top surface of the second type through vias to a position non-overlapped with the second type through vias. Conductive pins are formed on and electrically connected to the redistribution line, wherein the redistribution line and the conductive pins are formed through a second group of photomasks. The first semiconductor wafer is diced to separate out an array of first chips from the plurality of first chips. Second chips are formed on a second semiconductor wafer, wherein the second chips include connection pins. The semiconductor wafer is diced to separate out a second chip from the plurality of second chips. The array of first chips is bonded to the second chip by electrically connecting the conductive pins to the connection pins.

In some embodiments, forming the first chips on the first semiconductor wafer further includes forming an extended redistribution line disposed on and electrically connected to the second type through vias and the internal wire layer, wherein the extended redistribution line extends from the top surface of the second type through vias of one of the first chips across a dicing line towards the conductive pins of another one of the first chips.

In some embodiments, the method further includes forming conductive terminals disposed on and electrically connected to the first type through vias and the second type through vias.

In some embodiments, after bonding the array of first chips to the second chip, the first type through vias electrically connects the signals or power supply lines of the first chips to the conductive terminals, and the second type through vias electrically connects the signals or power supply lines of the second chip to the conductive terminals.

In the above embodiments, a redistribution line and conductive pins are used to electrically connect the signals of the logic chip (second chip) to the through substrate vias (TSVs) of the memory chips (first chips), whereby the signals are further routed to the conductive terminals (or bonding pads) located on the backside of the memory chips. As such, there is no need to redesign the photomask sets for fabricating the TSVs. In other words, the TSVs and the internal wire layer located under the redistribution line may be fabricated using common photomask sets, and the memory chips fabricated with the common photomasks can be used in plural stacked semiconductor devices with different partner logic chips.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
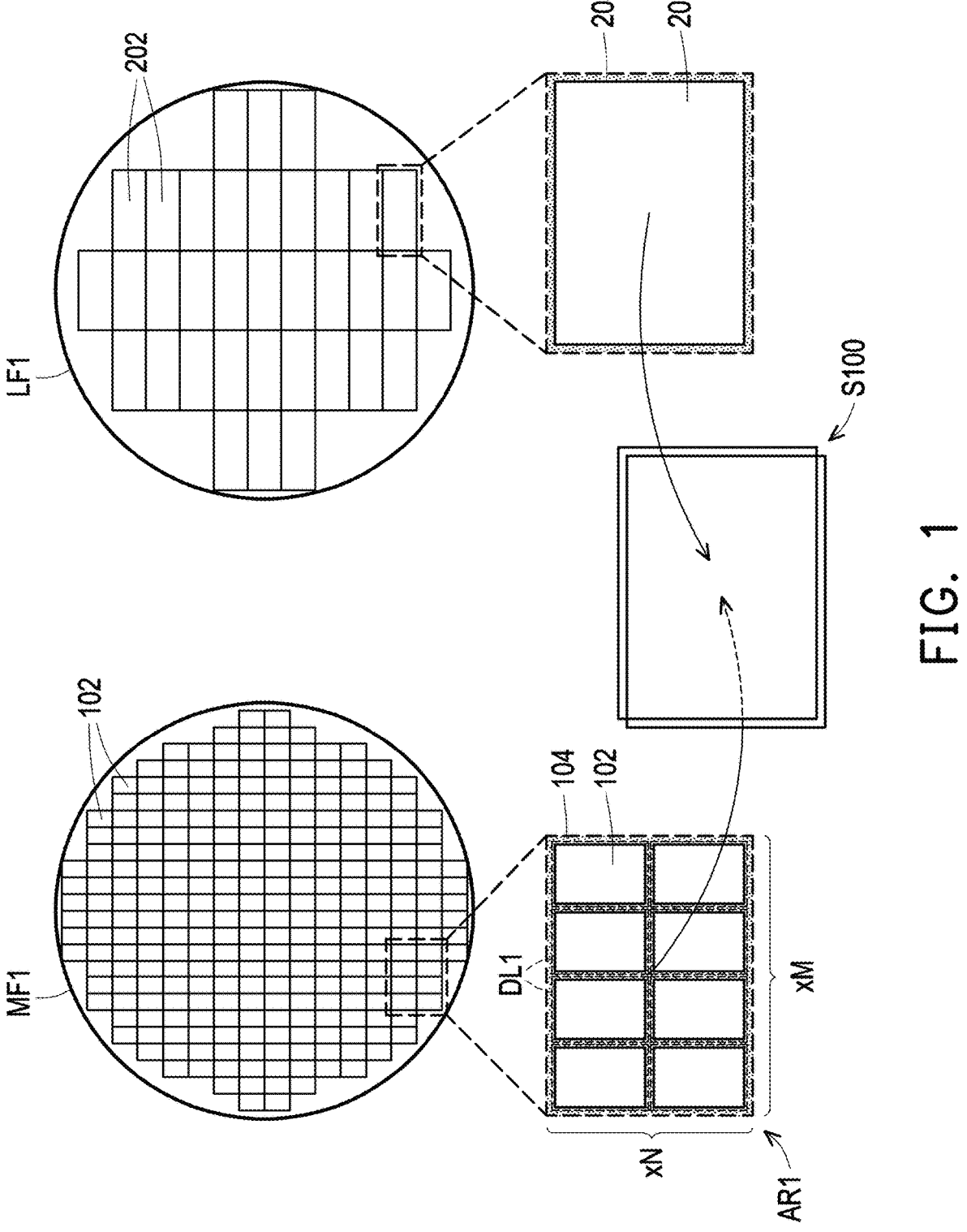
FIG. 1 is a schematic top view of a method of fabricating a stacked semiconductor device in accordance with some embodiments of the present disclosure.

FIG. 1 is a schematic top view of a method of fabricating a stacked semiconductor device in accordance with some embodiments of the present disclosure. Referring to FIG. 1, a first semiconductor wafer MF1 and a second semiconductor wafer LF1 are provided. In some embodiments, the first semiconductor wafer MF1 is a memory wafer whereas the second semiconductor wafer LF1 is a logic wafer. For example, in some embodiments, a plurality of first chips 102 (e.g., memory chips) are formed on the first semiconductor wafer MF1, while a plurality of second chips 202 (e.g. logic chips) are formed on the second semiconductor wafer LF1.

As illustrated in FIG. 1, the first semiconductor wafer MF1 may be diced to separate out an array AR1 of the first chips 102 from the wafer. For example, the first chips 102 are arranged in an array AR1 of N rows and M columns (xN:xM), wherein N and M are an integer. Although the illustrated array AR1 are shown to include the first chips 102 arranged in an array of 2 rows and 4 columns, the disclosure is not limited thereto. In other embodiments, the array AR1 may include the first chips 102 arranged in an array of more or less than 2 rows, and more or less than 4 columns. In other words, the number of rows N and the number of columns M is not particularly limited, and may be adjusted based on product requirement. In some embodiments, the first chips 102 in the array AR1 are surrounded by a molding compound 104 (or encapsulant). Furthermore, each of the first chips 102 are separated by dicing lines DL1, and are electrically isolated from one another in the array AR1.

As further illustrated in FIG. 1, the second semiconductor wafer LF may be diced to separate out a second chip 202. For example, one second chip 202 is separated from the second semiconductor wafer LF by cutting through dicing lines (not shown). In some embodiments, the second chip 202 is surrounded by a molding compound 204 (or encapsulant). After separating out the array AR1 of the first chips 102 and the second chip 202 from their respective wafers, the second chip 202 is stacked on the array AR1 of first chips 102 to form a stacked semiconductor device S100. The details of the first chips 102 and the second chip 202 will be described next with reference to FIG. 2A and FIG. 2B.

Figure 2A:
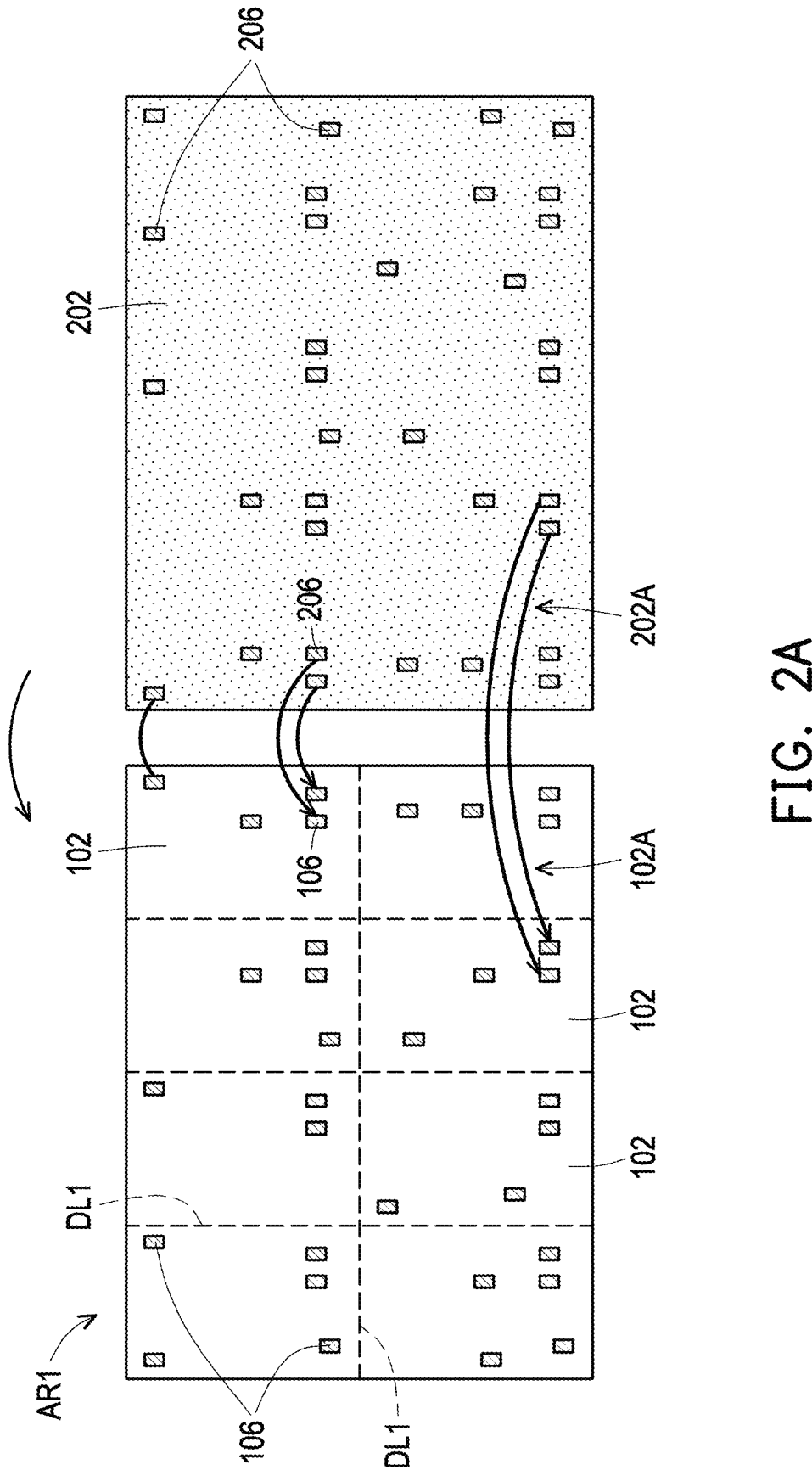
FIG. 2A and FIG. 2B are schematic top and sectional views of a second chip bonded to an array of first chips in accordance with some embodiments of the present disclosure.
Figure 2B:
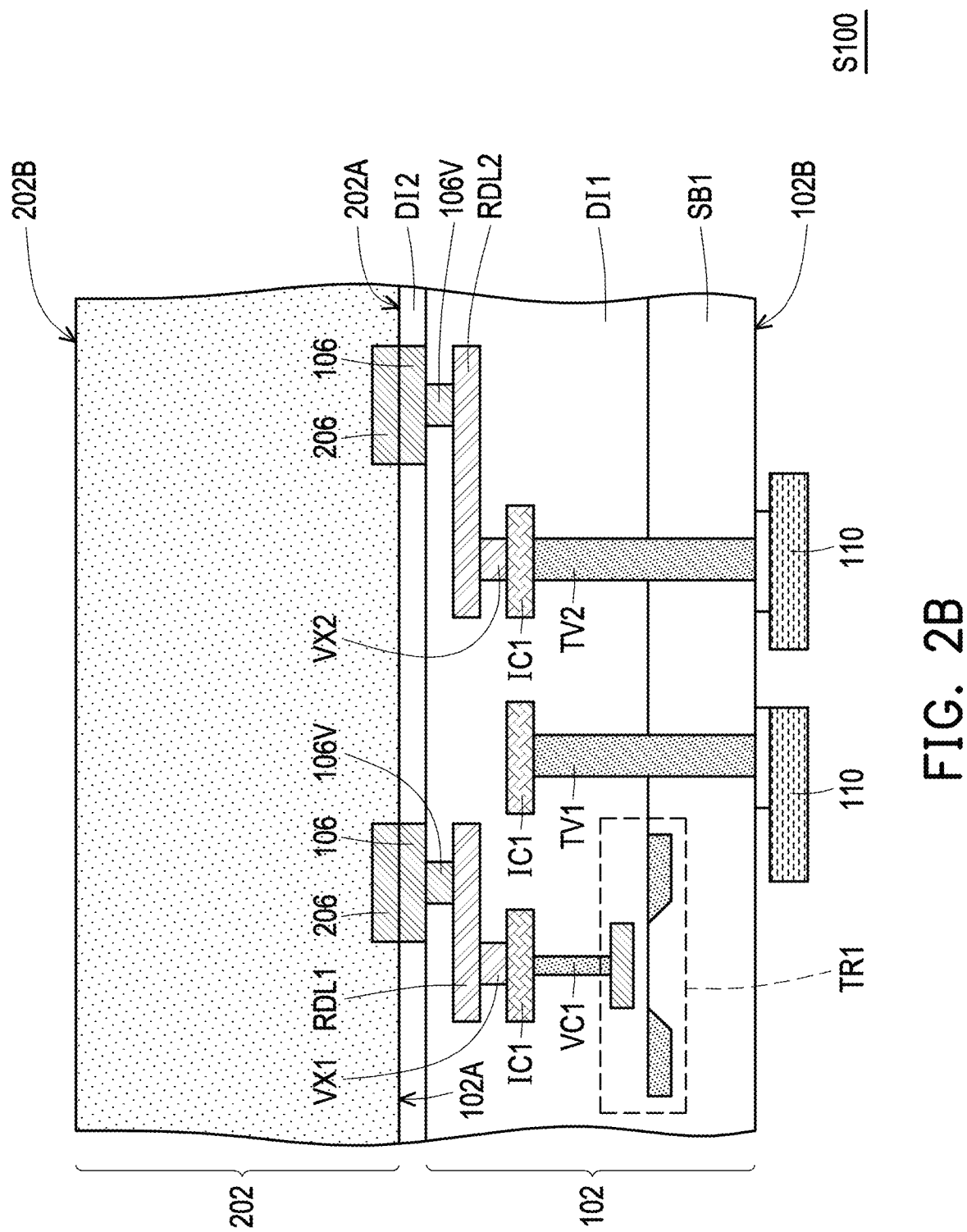

FIG. 2A and FIG. 2B are schematic top and sectional views of a second chip bonded to an array of first chips in accordance with some embodiments of the present disclosure. Referring to the top view of the array AR1 of first chips 102 and the top view of the second chip 202 illustrated in FIG. 2A, each of the first chips 102 includes a plurality of conductive pins 106 located on a front surface 102A of the first chips 102, while the second chip 202 includes a plurality of connection pins 206 located on a front surface 202A of the second chip 202. In some embodiments, the conductive pins 106 and the connection pins 206 may be made of conductive materials such as aluminum, titanium, copper, nickel, tungsten, or alloys thereof. In certain embodiments, an outline of the second chip 202 corresponds to an outline of the first chips 102 arranged in the array AR1. In the exemplary embodiment, the outline or shape of a total of eight first chips 102 arranged in the array AR1 matches the outline or shape of one second chip 202.

As further illustrated in FIG. 2A, the total number of connection pins 206 located on the front surface 202A of the second chip 202 are the same as the total number of conductive pins 106 located on the front surface 102A of the first chip 102. Furthermore, the conductive pins 106 on the front surface 102A of the first chip 102 are arranged in a mirror-image fashion with respect to the connection pins 206 on the front surface 202A of the second chip 202. As such, when bonding the second chip 202 to the array AR1 of first chips 102 in a face-to-face manner (e.g. bonding the front surface 102A to the front surface 202A), the connection pins 206 may be directly bonded and connected to the conductive pins 106.

As illustrated in FIG. 2B, the second chip 202 is bonded to the first chips 102 to form the stacked semiconductor device S100. As shown in FIG. 2B, each of the first chips 102 may include a wafer substrate SB1, such as a silicon substrate. A transistor structure TR1 may be formed on the substrate SB1. In some embodiments, dielectric layers DI1 (including one or a plurality of dielectric layers) may be formed on the wafer substrate SB1 to surround the transistor structure TR1. Furthermore, first type through vias TV1 and second type through vias TV2 (through substrate vias) may be formed over the wafer substrate SB1 and within the dielectric layers DI1, whereby the first type through vias TV1 and second type through vias TV2 penetrate through the wafer substrate SB1. In some embodiments, bonding pads (not labeled) and conductive terminals 110 are formed on the backside surface 102B of the first chips 102, whereby the bonding pads and conductive terminals 110 are disposed on and electrically connected to the first type through vias TV1 and second type through vias TV2.

As further shown in FIG. 2B, an internal wire layer including a plurality of internal wires IC1 are formed on and electrically connected to the first type through vias TV1 and second type through vias TV2. In some embodiments, the internal wires IC1 may be connected to the transistor structure TR1 through a via contact VC1. In some embodiments, a redistribution line RDL1 is formed over the transistor structure TR1. For example, the redistribution line RDL1 is disposed on and electrically connected to the transistor structure TR1 through the internal wire layer (including internal wires IC1), wherein the redistribution line RDL1 extends from an internal wire IC1 of the internal wire layer located on top of the transistor structure TR1 to a position away from the internal wire IC1. Similarly, a redistribution line RDL2 is formed over the second type through vias TV2. For example, the redistribution line RDL2 is disposed on and electrically connected to the second type through vias TV2 and the internal wire layer (including internal wires IC1), wherein the redistribution line RDL2 extends from a top surface of the second type through vias TV2 to a position non-overlapped with the second type through vias TV2. The redistribution line RDL1 and redistribution line RDL2 may be electrically connected to the internal wires IC1 located below through the conductive vias VX1, VX2 respectively.

After forming the redistribution line RDL1 and redistribution line RDL2, a dielectric layer DI2 is formed on the dielectric layers DI1, and conductive pins 106 are formed in the dielectric layer DI2, and formed on and electrically connected to the redistribution lines RDL1, RDL2. In some embodiments, the conductive pins 106 are electrically connected to the redistribution lines RDL1, RDL2 through the conductive vias 106V. In certain embodiments, the conductive pins 106 are exposed on the front surface 102A of the first chips 102.

In the exemplary embodiment, since a position of the connection pins 206 located on a front surface 202A of the second chip 202 are unique for each of the second chip 202 (logic chip), the corresponding position of the conductive pins 106 used for bonding to the connection pins 206 needs to be adjusted for each of the first chips 102 (memory chip) to ensure reliable bonding. To prevent the need to adjust the position of the first type through vias TV1 and second type through vias TV2, the redistribution lines RDL1, RDL2 are formed and used for routing the signals from the conductive pins 106 to the first type through vias TV1 and second type through vias TV2. As such, the first type through vias TV1, the second type through vias TV2 and the internal wire layer (including internal wires IC1) may be fabricated using common photomask sets (a first group of photomasks) for each of the first chips 102 (memory chip). On the other hand, custom photomask sets (a second group of photomasks) may be used to form the redistribution lines RDL1, RDL2 and the conductive pins 106 of the first chips 102 depending on the position of the connection pins 206 of the second chip 202.

After bonding the second chip 202 to the array AR1 of first chips 102, a stacked semiconductor device S100 in accordance with some embodiments of the present disclosure may be accomplished. In the stacked semiconductor device S100 having the above design, the first type through vias TV1 may electrically connect the signals or power supply lines of the first chips 102 (memory chip) to the conductive terminals 110, while the second type through vias TV2 may electrically connect the signals or power supply lines of the second chip 202 to the conductive terminals 110 (e.g., through the conductive pins 106 and the redistribution line RDL2). In the exemplary embodiment, a redistribution line RDL2 and conductive pins 106 are used to electrically connect the signals of the logic chip (second chip 202) to the second type through vias TV2 of the memory chips (first chips 102), whereby the signals are further routed to the conductive terminals 110 (or bonding pads) located on the backside surface 102B of the memory chips (first chips 102). As such, there is no need to redesign the photomask sets for fabricating the second type through vias TV2 in each of the first chips 102. In other words, the arrangement of the second type through vias TV2 in each of the first chips 102 may be the same. Overall, a stacked semiconductor device S100 is fabricated by bonding memory chips (first chips 102) with logic chip (second chip 202) without utilizing extra photomask sets.

The details of the connection of the redistribution lines provided in the array AR1 of first chips 102 will be described next with reference to FIG. 3A and FIG. 3B.

Figure 3A:
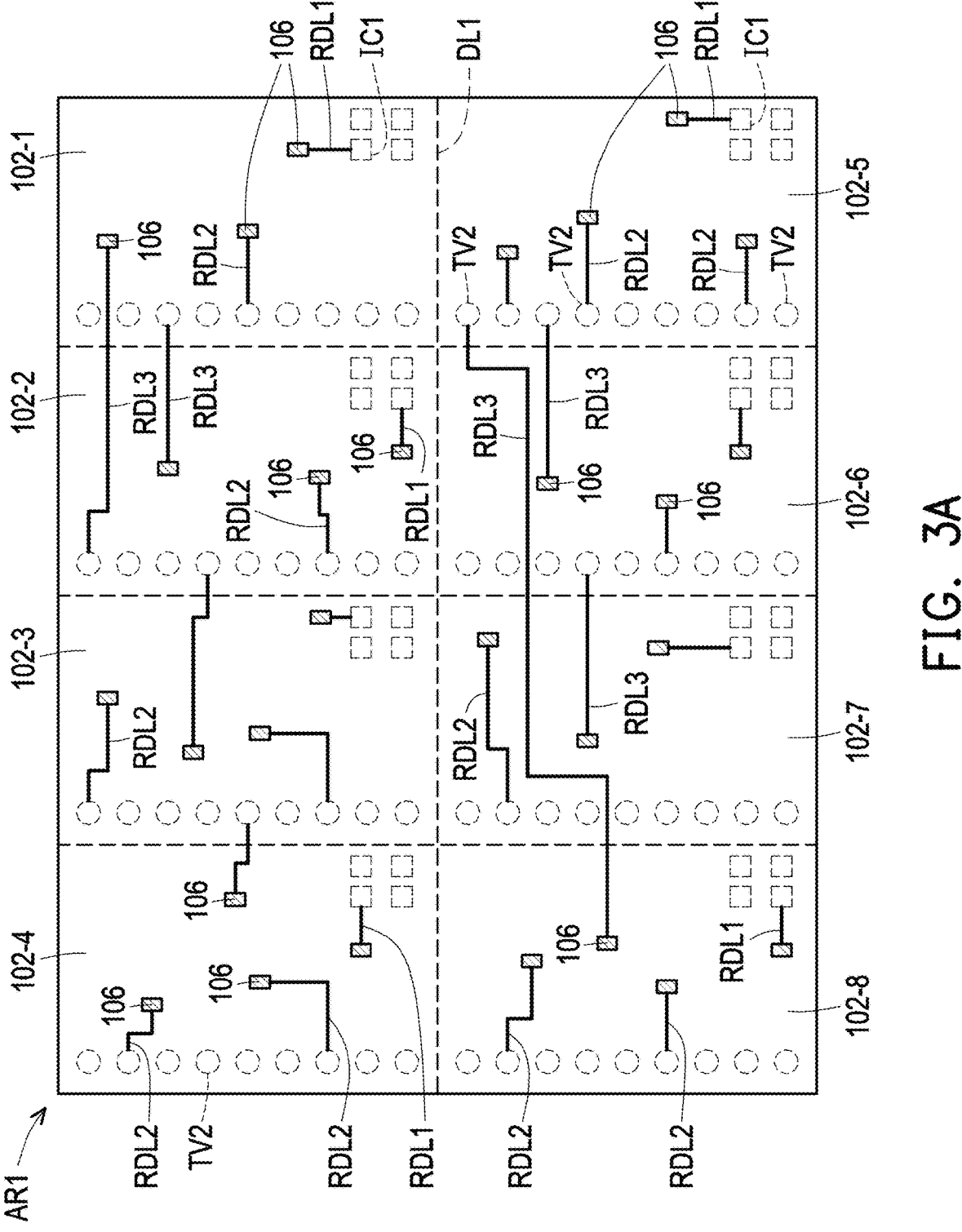
FIG. 3A is a schematic top view of the array of first chips in accordance with some embodiments of the present disclosure.

FIG. 3A is a schematic top view of the array of first chips in accordance with some embodiments of the present disclosure. FIG. 3B is an enlarged top view and sectional view of one first chip in accordance with some embodiments of the present disclosure.

Referring to FIG. 3A, the first chips 102 arranged in an array AR1 may include first chips 102-1, 102-2, 102-3, 102-4 located in a first row, and first chips 102-5, 102-6, 102-7, 102-8 located in a second row of the array AR1. In the exemplary embodiment, each of the first chips (102-1, 102-2, 102-3, 102-4, 102-5, 102-6, 102-7, 102-8) include conductive pins 106 revealed at the front surface of the first chips 102. In some embodiments, the redistribution line RDL1 electrically connect a conductive pin 106 to an internal wire IC1 of the internal wire layer located underneath. In certain embodiments, the redistribution line RDL1 may be electrically connected to the transistor structure TR1 through the internal wire IC1. In some embodiments, the redistribution line RDL2 electrically connect a conductive pin 106 to a second type through via TV2 located underneath. However, it is noted that the redistribution line RDL1 and the redistribution line RDL2 are routings that are provided within a span of the first chips 102. In other words, the redistribution lines RDL1, RDL2 do not extend beyond a boundary of each of the first chips (102-1, 102-2, 102-3, 102-4, 102-5, 102-6, 102-7, 102-8), and do not cross over the dicing lines DL1.

In some embodiments, the first chips 102 (including 102-1, 102-2, 102-3, 102-4, 102-5, 102-6, 102-7, 102-8) may further include an extended redistribution line RDL3 disposed on and electrically connected to the second type through vias TV2 and over the internal wire layer. For example, the extended redistribution line RDL3 may extend from the top surface of the second type through vias TV2 of one of the first chips (e.g., first chip 102-2) across the dicing lines DL towards the conductive pins 106 of another first chips (e.g., first chip 102-1). In the exemplary embodiment, the extended redistribution line RDL3 may extend across two adjacent first chips (e.g., from first chip 102-2 to first chip 102-1). In certain embodiments, the extended redistribution line RDL3 may extend across four adjacent first chips (e.g., from first chip 102-5 across first chips 102-6, 102-7 and to the first chip 102-8). In other words, the extended redistribution line RDL3 may extend across the dicing lines DL1 separating the first chips 102 (102-1, 102-2, 102-3, 102-4, 102-5, 102-6, 102-7, 102-8), and may provide routing across each of the first chips 102 (102-1, 102-2, 102-3, 102-4, 102-5, 102-6, 102-7, 102-8), which may be adjusted based on design requirements.

Figure 3B:
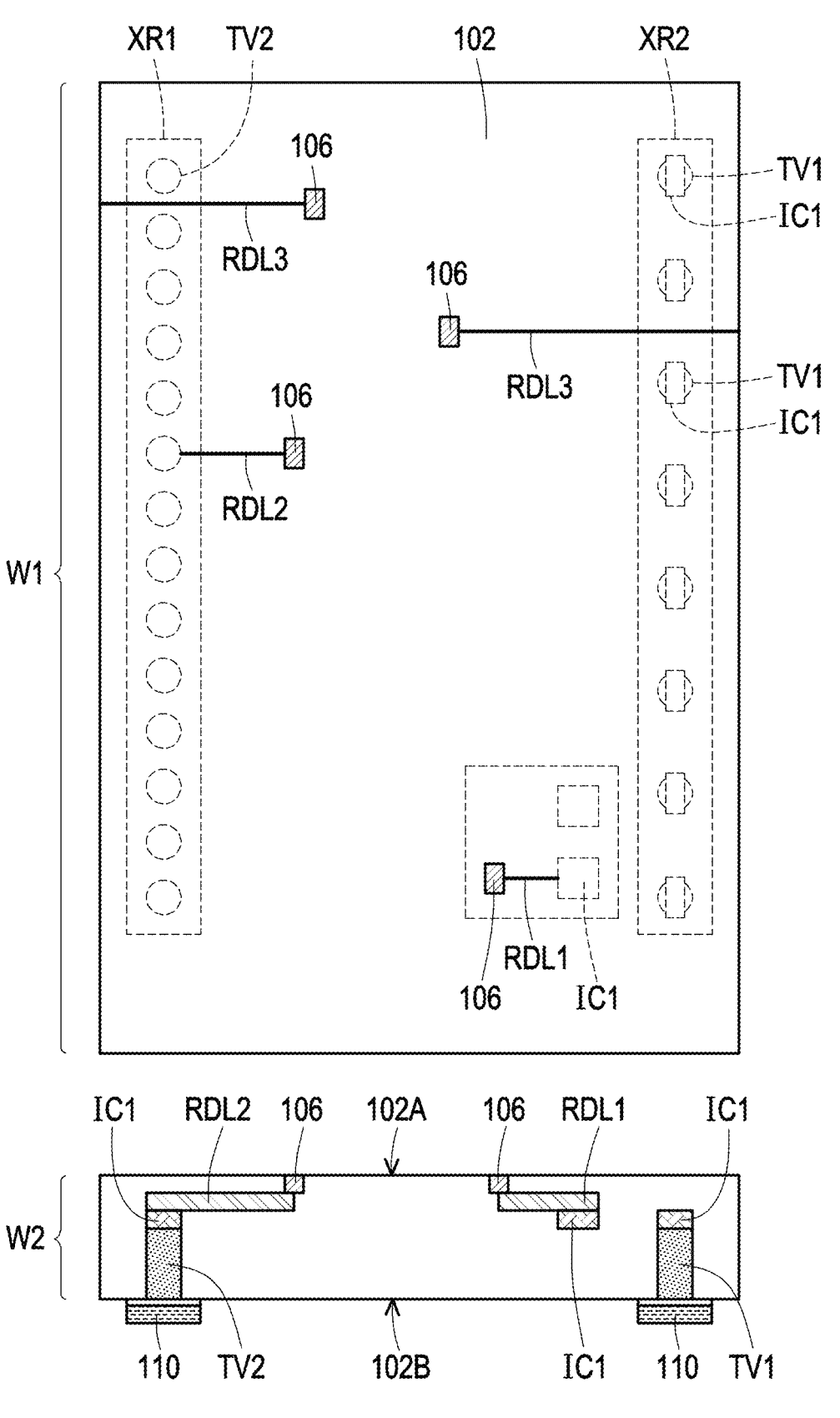
FIG. 3B is an enlarged top view and sectional view of one first chip in accordance with some embodiments of the present disclosure.

As further illustrated in FIG. 3B, in the top view W1 of the first chips 102 (including (102-1, 102-2, 102-3, 102-4, 102-5, 102-6, 102-7, 102-8), the first type through vias TV1 are arranged in a first column (in region XR2) in each of the first chips (102-1, 102-2, 102-3, 102-4, 102-5, 102-6, 102-7, 102-8), and the second type through vias TV2 are arranged in a second column (in region XR1) in each of the first chips (102-1, 102-2, 102-3, 102-4, 102-5, 102-6, 102-7, 102-8). In other words, the position of the first type through vias TV1 and the second type through vias TV2 are the same for each of the first chips 102-1, 102-2, 102-3, 102-4, 102-5, 102-6, 102-7, 102-8).

Furthermore, from the sectional view W2 of the first chips 102 (including 102-1, 102-2, 102-3, 102-4, 102-5, 102-6, 102-7, 102-8), it can be seen that the first type through vias TV1 electrically connects the signals or power supply lines (from the internal wires IC1) of the first chips 102 to the conductive terminals 110. On the other hand, the second type through vias TV2 electrically connects the signals or power supply lines of the second chip 202 (not shown) to the conductive terminals 110 by using the redistribution line RDL2. As such, since the position of the first type through vias TV1 and the second type through vias TV2 are maintained the same in each of the first chips 102 in the array AR1, common photomask sets can be used for their fabrication. Overall, a stacked semiconductor device S100 is fabricated by bonding memory chips (first chips 102) with logic chip (second chip 202) without utilizing extra photomask sets.

Figure 3C:
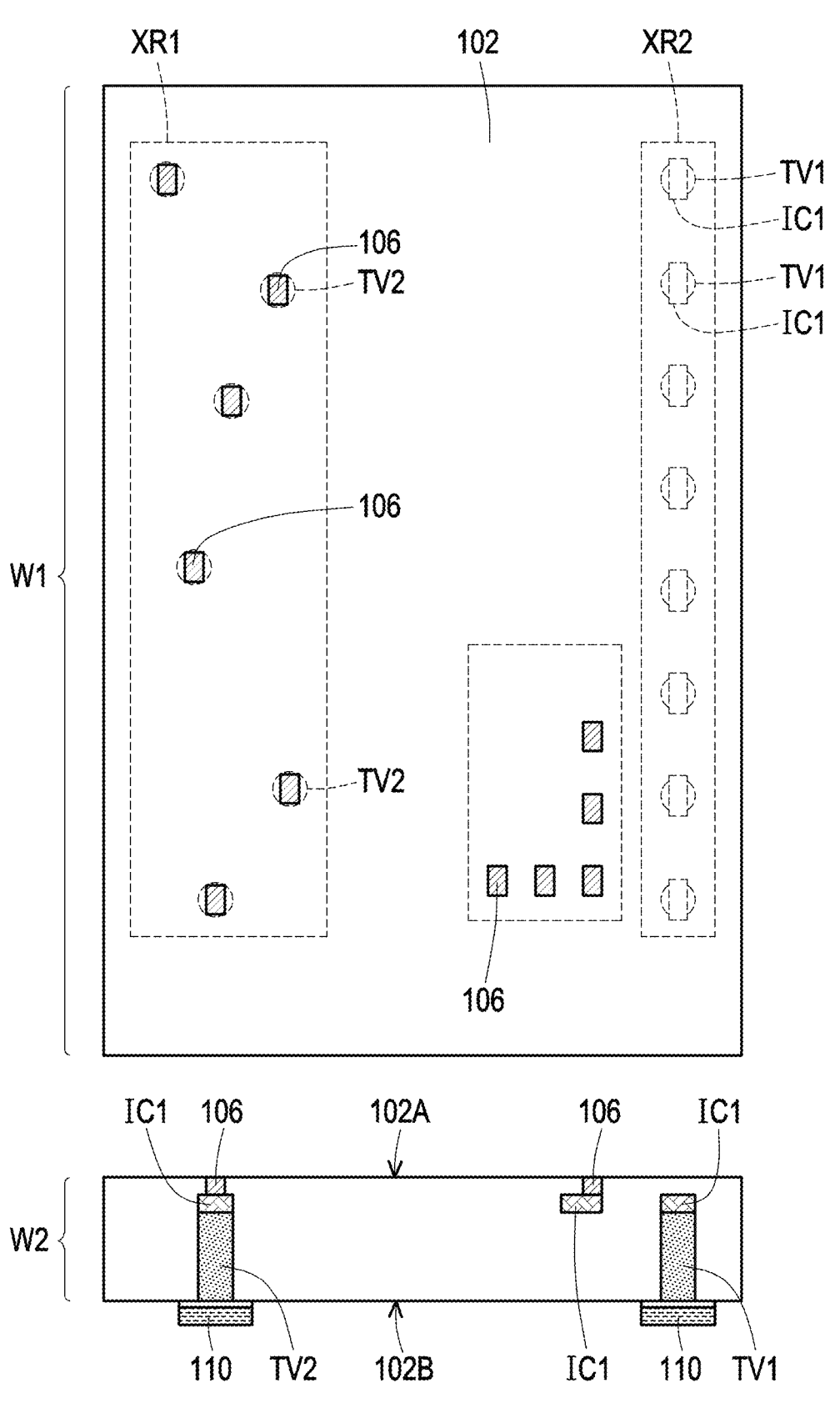
FIG. 3C is an enlarged top view and sectional view of one first chip in accordance with some comparative embodiments of the present disclosure.

FIG. 3C is an enlarged top view and sectional view of one first chip in accordance with some comparative embodiments of the present disclosure. In the comparative embodiment shown in FIG. 3C, the second type through vias TV2 are directly connected to the conductive pins 106 through the internal wires IC1 (see sectional view W2), and a redistribution line is omitted. As the position of the conductive pins 106 of the first chips 102 needs to match the position of the connection pins 206 of the second chip 202, the position of the second type through vias TV2 located directly below the conductive pins 206 also needs to be re-designed. In other words, the second type through vias TV2 located in each of the first chips 102 may be at different positions, and extra custom photomask sets will be required for fabricating these through vias at varied positions.

Figure 4:
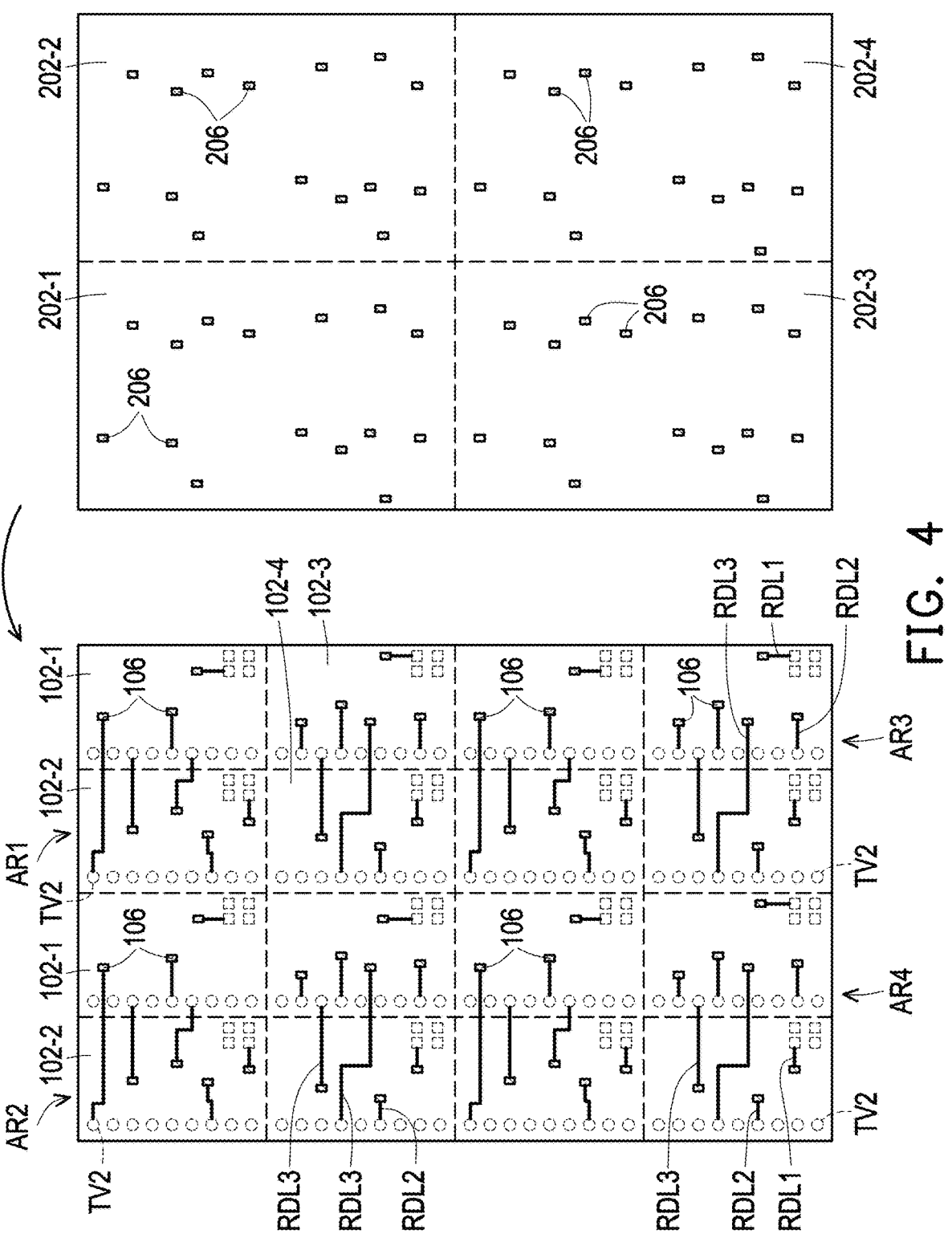
FIG. 4 is a schematic top view of an array of second chips bonded to an array of first chips in accordance with some embodiments of the present disclosure.

FIG. 4 is a schematic top view of an array of second chips bonded to an array of first chips in accordance with some embodiments of the present disclosure. The embodiment shown in FIG. 4 may be similar to the embodiments described previously. Therefore, the same reference numerals are used to refer to the same or liked parts, and its detailed description will be omitted herein. Referring to FIG. 4, in some embodiments, an array of second chips 202 (including 202-1, 202-2, 202-3, 202-4) are bonded to an array (including AR1, AR2, AR3, AR4) of first chips 102. For example, the second chip 202-1 is bonded to the array AR1 of the first chips 102, the second chip 202-2 is bonded to the array AR2 of the first chips 102, the second chip 202-3 is bonded to the array AR3 of the first chips 102, and the second chip 202-4 is bonded to the array AR4 of the first chips 102.

As illustrated in FIG. 4, each of the array AR1, AR2, AR3, AR4 of the first chip 102 may include first chips 102-1, 102-2, 102-3, 102-4 that are arranged in an array of 2 rows and 2 columns. Similar to the above embodiments, a redistribution line RDL2, an extended redistribution line RDL3 and conductive pins 106 are used to electrically connect the signals of the logic chip (second chip 202) to the second type through vias TV2 of the memory chips (first chips 102), whereby the signals are further routed to the conductive terminals 110 (not shown) located on the backside surface of the memory chips (first chips 102). As such, there is no need to redesign the photomask sets for fabricating the second type through vias TV2 in each of the first chips 102. In other words, the arrangement of the second type through vias TV2 in each of the first chips 102 may be the same. Overall, a stacked semiconductor device S100 is fabricated by bonding memory chips (first chips 102) with logic chip (second chip 202) without utilizing extra photomask sets.

In the above embodiments, a redistribution line and conductive pins are used to electrically connect the signals of the logic chip (second chip) to the through substrate vias (TSVs) of the memory chips (first chips), whereby the signals are further routed to the conductive terminals (or bonding pads) located on the backside of the memory chips. As such, there is no need to redesign the photomask sets for fabricating the TSVs. In other words, the TSVs and the internal wire layer located under the redistribution line may be fabricated using common photomask sets, and the memory chips fabricated with the common photomasks can be used in plural stacked semiconductor devices with different partner logic chips. Overall, the method of fabricating the stacked semiconductor device can be simplified.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A stacked semiconductor device, comprising:
   a plurality of first chips arranged in an array, wherein each of the plurality of first chips arranged in the array are separated by dicing lines, and each of the plurality of first chips comprises:
   first type through vias and second type through vias;

an internal wire layer disposed on and electrically connected to the first type through vias and the second type through vias;

a redistribution line disposed on and electrically connected to the second type through vias and the internal wire layer, wherein the redistribution line extends from a top surface of the second type through vias to a position non-overlapped with the second type through vias;

a plurality of conductive pins disposed on and electrically connected to the redistribution line; and an extended redistribution line disposed on and electrically connected to the second type through vias and the internal wire layer, wherein the extended redistribution line extends from the top surface of the second type through vias of one of the plurality of first chips across the dicing lines towards the plurality of conductive pins of another one of the plurality of first chips;

a second chip stacked on the plurality of first chips, wherein the second chip comprises a plurality of connection pins, and the second chip is connected to the plurality of first chips by bonding the plurality of connection pins to the plurality of conductive pins.

2. The stacked semiconductor device according to claim 1, wherein the plurality of first chips is arranged in an array of N rows and M columns, and N and M are an integer, and wherein an outline of the second chip corresponds to an outline of the plurality of first chips arranged in the array.

3. The stacked semiconductor device according to claim 2, wherein a single second chip is bonded to the plurality of first chips arranged in an array of 2 rows and 4 columns.

4. The stacked semiconductor device according to claim 2, wherein a single second chip is bonded to the plurality of first chips arranged in an array of 2 rows and 2 columns.

5. The stacked semiconductor device according to claim 1, wherein the extended redistribution line extends across two adjacent first chips of the plurality of first chips.

6. The stacked semiconductor device according to claim 1, wherein the extended redistribution line extends across four adjacent first chips of the plurality of first chips.

7. The stacked semiconductor device according to claim 1, further comprising conductive terminals disposed on and electrically connected to the first type through vias and the second type through vias.

8. The stacked semiconductor device according to claim 7, wherein the first type through vias electrically connects the signals or power supply lines of the plurality of first chips to the conductive terminals, and the second type through vias electrically connects the signals or power supply lines of the second chip to the conductive terminals.

9. The stacked semiconductor device according to claim 1, wherein the first type through vias are arranged in a first column in each of the plurality of first chips, and the second type through vias are arranged in a second column in each of the plurality of first chips.

10. The stacked semiconductor device according to claim 1, wherein each of the plurality of first chips further comprises:

a transistor structure; and another redistribution line disposed on and electrically connected to the transistor structure through the internal wire layer, wherein the another redistribution line extends from an internal wire of the internal wire layer located on top of the transistor structure to a position away from the internal wire, and wherein the plurality of conductive pins is disposed on and electrically connected to the another redistribution line.

11. The stacked semiconductor device according to claim 1, wherein the plurality of first chips include memory chips and the second chip includes a logic chip.

12. A method of fabricating a stacked semiconductor device, comprising:

forming a plurality of first chips on a first semiconductor wafer by:

forming first type through vias and second type through vias over a first wafer substrate;

forming an internal wire layer disposed on and electrically connected to the first type through vias and the second type through vias, wherein the first type through vias, the second type through vias and the internal wire layer are formed through a first group of photomasks;

forming a redistribution line disposed on and electrically connected to the second type through vias and the internal wire layer, wherein the redistribution line extends from a top surface of the second type through vias to a position non-overlapped with the second type through vias; and forming a plurality of conductive pins disposed on and electrically connected to the redistribution line, wherein the redistribution line and the plurality of conductive pins are formed through a second group of photomasks;

dicing the first semiconductor wafer to separate out an array of first chips from the plurality of first chips;

forming a plurality of second chips on a second semiconductor wafer, wherein the second chips comprise a plurality of connection pins;

dicing the second semiconductor wafer to separate out a second chip from the plurality of second chips; and bonding the array of first chips to the second chip by electrically connecting the plurality of conductive pins to the plurality of connection pins.

13. The method according to claim 12, wherein forming the plurality of first chips on the first semiconductor wafer further comprises:

forming an extended redistribution line disposed on and electrically connected to the second type through vias and the internal wire layer, wherein the extended redistribution line extends from the top surface of the second type through vias of one of the plurality of first chips across a dicing line towards the plurality of conductive pins of another one of the plurality of first chips.

14. The method according to claim 12, further comprises forming conductive terminals disposed on and electrically connected to the first type through vias and the second type through vias.

15. The method according to claim 14, wherein after bonding the array of first chips to the second chip, the first type through vias electrically connects the signals or power supply lines of the plurality of first chips to the conductive terminals, and the second type through vias electrically connects the signals or power supply lines of the second chip to the conductive terminals.

* * * * *